United States Patent
Wuister

(10) Patent No.: US 9,086,621 B2
(45) Date of Patent: Jul. 21, 2015

(54) METHODS FOR PROVIDING SPACED LITHOGRAPHY FEATURES ON A SUBSTRATE BY SELF-ASSEMBLY OF BLOCK COPOLYMERS

(71) Applicant: ASML Netherlands B.V., Veldhoven (NL)

(72) Inventor: Sander Frederik Wuister, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/391,146

(22) PCT Filed: Mar. 19, 2013

(86) PCT No.: PCT/EP2013/055683
§ 371 (c)(1),
(2) Date: Oct. 7, 2014

(87) PCT Pub. No.: WO2013/156240
PCT Pub. Date: Oct. 24, 2013

(65) Prior Publication Data
US 2015/0064915 A1 Mar. 5, 2015

Related U.S. Application Data

(60) Provisional application No. 61/636,346, filed on Apr. 20, 2012.

(51) Int. Cl.
*H01L 21/311* (2006.01)
*G03F 7/00* (2006.01)
(Continued)

(52) U.S. Cl.
CPC ............. *G03F 7/0002* (2013.01); *B44C 1/227* (2013.01); *B82Y 10/00* (2013.01); *B82Y 40/00* (2013.01);
(Continued)

(58) Field of Classification Search
USPC ........................................................ 438/700
See application file for complete search history.

(56) References Cited

U.S. PATENT DOCUMENTS

| 2008/0093743 | A1 | 4/2008 | Yang et al. |
| 2009/0001045 | A1 | 1/2009 | Chen et al. |

(Continued)

FOREIGN PATENT DOCUMENTS

| WO | 2008/094746 | 8/2008 |
| WO | 2008/097736 | 8/2008 |
| WO | 2013/050338 | 4/2013 |

OTHER PUBLICATIONS

International Search Report mailed Jul. 5, 2013 in corresponding Internaitonal Patent Application No. PCT/EP2013/055683
(Continued)

*Primary Examiner* — Asok K Sarkar
(74) *Attorney, Agent, or Firm* — Pillsbury Winthrop Shaw Pittman LLP

(57) ABSTRACT

A method is disclosed for forming a row of mutually spaced lithography features on a substrate, such as contact electrodes for a NAND device. The method involves forming and/or using a narrow slot over the substrate defined between the edge of a hard mask layer and a side wall of a trench in a resist layer overlying the edge and the substrate. A self-assemblable block copolymer is deposited and ordered in the trench for use as a further resist for patterning the substrate along the slot. The method allows for a sub-resolution contact array to be formed using UV lithography by overlapping the trench with the hard mask edge to provide the narrow slot in which the contact electrodes may be formed.

20 Claims, 4 Drawing Sheets

(51) Int. Cl.
| | |
|---|---|
| *B82Y 10/00* | (2011.01) |
| *B82Y 40/00* | (2011.01) |
| *B44C 1/22* | (2006.01) |
| *C30B 19/12* | (2006.01) |
| *C30B 29/58* | (2006.01) |
| *H01L 21/027* | (2006.01) |
| *H01L 21/308* | (2006.01) |
| *H01L 27/11* | (2006.01) |

(52) U.S. Cl.
CPC ................ *C30B 19/12* (2013.01); *C30B 29/58* (2013.01); *G03F 7/0035* (2013.01); *H01L 21/0271* (2013.01); *H01L 21/3081* (2013.01); *H01L 21/3083* (2013.01); *H01L 27/11* (2013.01)

(56) References Cited

U.S. PATENT DOCUMENTS

2010/0316849 A1   12/2010  Millward et al.
2013/0034811 A1*   2/2013  Peeters et al. .............. 430/270.1
2013/0266727 A1*  10/2013  Peeters et al. .............. 427/248.1

OTHER PUBLICATIONS

Miri Park et al., "Block Copolymer Lithography: Periodic Arrays of ~$10^{11}$ Holes in 1 Square Centimeter," Science, vol. 276, pp. 1401-1404 (May 30, 1997).

Joy Y. Cheng et al., "Templated Self-Assembly of Block Copolymers: Effect of Substrate Topography," Adv. Matter, vol. 15, No. 19, pp. 1599-1602 (Oct. 2, 2003).

\* cited by examiner

METHODS FOR PROVIDING SPACED LITHOGRAPHY FEATURES ON A SUBSTRATE BY SELF-ASSEMBLY OF BLOCK COPOLYMERS

CROSS-REFERENCE TO RELATED APPLICATIONS

This application is the U.S. national phase entry of PCT patent application no. PCT/EP2013/055683, which was filed on Mar. 19, 2013, which claims the benefit of priority of U.S. provisional application no. 61/636,346, which was filed on Apr. 20, 2012, which is incorporated herein in its entirety by reference.

FIELD

The present invention relates to a method of forming mutually spaced lithography features in a row, or rows, on a substrate, by use of self-assembly of a block copolymer over a slot provided on the substrate. The method may be useful for forming a contact electrode array for a NAND memory device.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, for example of an imprint template or of other substrates, and chemical resists may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

A self-assemblable block copolymer is a compound useful in nanofabrication because it may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometres or even less than 10 nm. The size and shape of the domains may be controlled by manipulating the molecular weight and composition of the different block types of the copolymer. The interfaces between the domains may have a line width roughness of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer such as (A-B-C) block copolymer may be useful, as may an alternating or periodic block copolymer e.g. $[\text{-A-B-A-B-A-B-}]_n$ or $[\text{-A-B-C-A-B-C}]_m$ where n and m are integers. The blocks may be connected to each other by covalent links in a linear or branched fashion (e.g., a star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the phases formed. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative molecular volume fractions of the different polymer blocks. For instance, a molecular volume ratio of 80:20 will provide a cubic phase of discontinuous spherical domains of the low volume block arranged in a continuous domain of the higher volume block. As the volume ratio reduces to 70:30, a cylindrical phase will be formed with the discontinuous domains being cylinders of the lower volume block. At 50:50 ratio, a lamellar phase is formed. With a ratio of 30:70, an inverted cylindrical phase may be formed and at a ratio of 20:80, an inverted cubic phase may be formed.

Suitable block copolymers for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes substantially parallel or perpendicular to the substrate and lamellar and cylindrical phases are interesting for lithography applications, as they may provide a resist to form line and space patterns and hole arrays, respectively, when oriented with their domains lying side-by-side on a substrate, and may provide good contrast when one of the domain types is subsequently etched.

It will be understood a block copolymer comprising two or more differing block copolymer molecule types may be used for self-assembly.

Two methods used to guide or direct self-assembly of a polymer, such as a block copolymer, onto a surface are graphoepitaxy and chemical pre-patterning, also called chemical epitaxy. In the graphoepitaxy method, self-organization of block copolymer is guided by topological pre-patterning on the substrate. Lamellar self-assembled block copolymer can form substantially parallel linear patterns with adjacent lines of the different polymer block domains in the enclosures or trenches defined by one or more side walls of the graphoepitaxy template. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the graphoepitaxy template by a side wall being spaced to fit several domains of the block copolymer side-by-side. For hexagonal or tetragonal (cylindrical) ordered patterns, the graphoepitaxy features may be pillars standing in place of cylindrical domains of the ordered pattern of the block copolymer.

In the chemical pre-patterning method (referred to herein as chemical epitaxy), the self-assembly of block copolymer domains is guided by a chemical pattern (i.e. a chemical epitaxy template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical epitaxy pattern may comprise a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of the pre-patterned features on the substrate (so-called density or pitch multiplication). As was the case with graphoepitaxy, chemical pre-patterning is not limited to a linear pre-pattern; for instance the chemical epitaxy template may be in the form of a 2-D array of dots suitable as a pattern for use with a cylindrical (e.g. hexagonal or square pattern) phase-forming block copolymer. Graphoepitaxy and chemical pre-patterning may be used, for instance, to guide the self-organization of lamellar or cylindrical phases, so that the different domain types are arranged side-by-side on a surface of a substrate.

Typically, the height of features of a graphoepitaxy template may be of the order of the thickness of the block copolymer layer to be ordered, so may be, for instance, from about 20 nm to about 150 nm whereas for a chemical epitaxy template, the height difference between adjacent regions of a chemical epitaxy template will typically be less than about 15 nm, say less than about 10 nm or even less than about 5 nm in order to reduce or minimize likelihood of defect formation.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented substantially parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between adjacent domains of different blocks lying substantially perpendicular to the plane of the surface.

A neutral surface for use in chemical epitaxy and graphoepitaxy is particularly useful. It may be used on surfaces between specific orientation regions of an epitaxy template. For instance in a chemical epitaxy template to align a di-block copolymer having A and B blocks, where A is hydrophilic and B is hydrophobic in nature, the chemical pattern may comprise hydrophobic pinning sites with a neutral orientation region between the hydrophobic sites. The B domain may preferentially assemble onto the hydrophobic pinning sites, with several alternating domains of A and B blocks aligned over the neutral region between the specific (pinning) orientation regions of the chemical epitaxy template.

For instance in a graphoepitaxy template to align such a di-block copolymer the pattern may comprise hydrophobic resist features as pillars or side-walls with a neutral orientation region between the hydrophobic resist features. The B domain may preferentially assemble alongside the hydrophobic resist features, with several alternating domains of A and B blocks aligned over the neutral orientation region between the pinning resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to about 40 nm, or less than or equal to about 20 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable block copolymer may be deposited onto a substrate having a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare.

It would be desirable to have a process and method to form mutually spaced lithography features along a substrate by use of self-assembly of a block copolymer to form a single row, or rows, of spaced elongate domains along a portion of a substrate. In particular, such a method is desirable, for example, for forming a contact electrode array for a NAND memory device by using the spaced elongate domains as resist features for patterning of the substrate.

It is also desirable that the pattern features should be of small size (width or diameter of say about 20 nm or less) and that the spacing between adjacent features should be as small as possible—say having a periodic spacing of about 50 nm or less.

It is desirable, for example, to provide a simple method for providing such lithography features on a substrate surface. It is desirable, for example, to provide a self-assembled layer of block copolymer for subsequent use as a resist layer suitable for use in device lithography to form a row of mutually spaced elongate features. It is desirable, for example, to provide a method using photolithography, for instance with actinic radiation such as UV or DUV radiation, to form a template for directing self-assembly of the block copolymer to form such a row of lithography features.

It is desirable, for example, to provide mutually spaced elongate lithography features with small pattern feature size and spacing compared to prior mutually spaced elongate lithography features prepared using resist-based UV photolithography.

In an aspect of the invention, there is provided a method of forming a row of mutually spaced lithography features on a substrate, the method comprising providing a hard mask layer on the substrate, the hard mask layer defining an edge, providing a resist layer on the substrate overlying the edge, forming a trench through the resist layer, by removal of a selected portion of the resist layer, aligned such that the trench has a length lying substantially parallel to the edge, the trench having opposed side-walls of resist and a base including the edge, a portion of the hard mask layer and a portion of the substrate, wherein the edge and a side-wall of the trench define a slot over the substrate, the slot having a width less than a width of the trench, providing a layer self-assemblable block copolymer, having first and second blocks, in the trench, causing the block copolymer to self-assemble to give an ordered layer in the trench, wherein the block copolymer is adapted to form the ordered layer comprising a row of first domains of first block, self-assembled side-by-side in the slot, alternating with a second domain of the second block, and using the ordered layer of block copolymer as a further resist layer for etching the row of mutually spaced lithography features along the slot on the substrate.

The following features are applicable to all the various aspects of the invention where appropriate. When suitable, combinations of the following features may be employed as part of the embodiments of the invention, for instance as set out in the claims. An embodiment of the invention is particularly suitable for use in device lithography. For instance, an embodiment of the invention may be of use in patterning a device substrate directly or may be of use in patterning an imprint template for use in imprint lithography.

The self-assemblable block copolymer may be a block copolymer as set out hereinbefore comprising at least two different block types, referred to as first and second polymer blocks, which are self-assemblable into an ordered polymer layer having the different block types associated into first and second domain types. The block copolymer may comprise a di-block copolymer and/or tri-block or multi-block copolymers. An alternating or periodic block copolymer may also be used as the self-assemblable polymer. Although only two domain types may be mentioned in some of the following aspects and examples, an embodiment of the invention is also applicable to a self-assemblable polymer with three or more different domain types. The self-assemblable block copolymer is desirably a di-block copolymer.

By "chemical affinity", in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity. Chemical affinities of surfaces may be measured, for instance, by means of contact angle measurements using various liquids, so that if one surface has the same contact angle for a liquid as another surface, the two surfaces may be said to have substantially the same chemical affinity for the liquid. If the contact angles differ for the two surfaces, the surface with the smaller contact angle has a higher chemical affinity for the liquid than the surface with the larger contact angle.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis substantially normal to the substrate surface and passing through the centroid of the feature. Thickness may suitably be measured by a technique such as interferometry or assessed through knowledge of etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

In an embodiment, the method involves providing a hard mask layer on the substrate, the hard mask layer defining an edge. The edge will typically be a straight edge. A conventional hard mask layer, known in the art, may be employed, and may be of a material such as silicon nitride, silicon oxide, diamond-like carbon, silicon oxynitride, metal, or the like. The hard mask layer will typically be highly resistant to a chemical etch used for the overlying resist layer, and will typically be a layer less than about 20 nm say less than about 10 nm, even about less than 5 nm in thickness. Deposition of the hard mask may be achieved using sputtering, plasma deposition, chemical vapor deposition or the like, with the edge delineated, for instance, by UV or DUV photolithography and suitable chemical etching.

A resist layer is provided on the substrate, overlying the edge. The resist layer may be provided by any suitable method, such as spin coating of a resist solution in a solvent followed by evaporative drying to provide the resist layer on the substrate. Typically, the resist layer may be a positive tone resist. By a positive tone resist, is meant a resist which, once exposed to actinic radiation, becomes or is rendered soluble in a solvent so that when subjected to rinsing with the solvent, one or more exposed portions of the resist are washed away while one or more unexposed portions of the resist remain insoluble in the solvent. However, an embodiment of the invention may be put into effect by use of a negative tone resist (where one or more unexposed portions remain and one or more exposed portions are removed), selectively exposed in an appropriate manner.

A trench is formed through the resist layer by removal of a selected portion of the resist layer, aligned such that the trench has a length lying substantially parallel to the edge. The trench has opposed side-walls of resist, and a base including the edge, a portion of the hard mask layer and a portion of the substrate. A further layer or layers may be present over the edge and over the substrate, as set out hereinafter. However, the resist over the base of the trench is completely removed. This is typically achievable by selective exposure of the resist to actinic radiation, such as UV radiation, followed by removal of the exposed (positive tone resist) or unexposed (negative tone resist) regions. The actinic radiation may be UV radiation such as DUV (deep UV) or EUV (extreme UV). The selective exposure to actinic radiation may be by patterning of the UV radiation with a lithography apparatus. A conventional lithographic patterning method such as mask or maskless UV lithography may be used to provide a desired high resolution exposure pattern on the resist layer to give the exposed and unexposed regions. Typical DUV lithography is carried out using UV radiation having a wavelength of about 193 nm.

The edge and a side-wall of the trench define a slot over the substrate, the slot having a width less than a width of the trench. Suitably, the trench has a width of about 100 nm or less such as about 50 nm or less (measured normal to the substrate axis at the trenches greatest width).

The substrate may typically be a semiconductor substrate, and may comprise a plurality of layers forming the substrate. For instance, the outermost layer of the substrate upon which the resist layer is provided, may be an ARC (anti-reflection coating) layer. Suitably, the outermost layer of the substrate may be neutral to the domains of the block copolymer, by which it is meant that it has a similar chemical affinity for each of the domain types of the block copolymer. Alternatively or additionally, a neutral orientation layer may be provided as an uppermost or outermost surface layer of the substrate, as described hereinafter.

A layer of self-assemblable block copolymer, having first and second blocks, is then provided in the trench. This may be carried out by spin coating of the block copolymer from a solution followed by removal of solvent, for instance. The self-assemblable block copolymer is subsequently caused to self-assemble, for instance by lowering the temperature to a temperature less than To/d for the block copolymer, to give an ordered layer of self-assembled block copolymer in the trench. The block copolymer is adapted to form the ordered layer comprising a row of first domains of the first block, self-assembled side-by-side in the slot, alternating with a second domain of the second block.

The ordered layer of self-assembled block copolymer may be used as a further resist layer for etching the row of mutually spaced lithography features along the slot on the substrate.

The trench may comprise one or more epitaxy features configured to direct self-assembly of the self-assemblable block copolymer.

The epitaxy feature may comprise a graphoepitaxy template. The graphoepitaxy template may comprise one or more recesses or one or more buttresses of a side-wall of the trench. In a further suitable arrangement, the graphoepitaxy template may comprise a transverse wall of the trench, having a face with a higher chemical affinity for one of the first and second domains than for the other of the first and second domains, the transverse wall lying across the trench with the face substantially normal to the substrate and substantially normal to the substrate axis. The transverse wall may be an end wall of the trench. The transverse wall, buttress or recess may be formed during the same process used to form the trench, or may be provided in a separate process step (such as conventional UV, DUV, EUV or electron beam lithography).

Alternatively or additionally, the epitaxy feature may comprise a chemical epitaxy template, such as a chemical epitaxy template comprising one or more pinning stripes on the base of the trench, the stripe lying across the trench, on the substrate, substantially normal to the substrate axis, and the stripe having a higher chemical affinity for one of the first and second domains than for the other of the first and second domains. Such a chemical epitaxy template may be deposited using a conventional DUV or EUV or electron beam lithography technique, such as are known in the art, prior to deposition of the resist layer used for forming the trench. Alternatively, such chemical epitaxy template may be put in place after the trench has been formed but before providing the block copolymer into the trench. It will be understood that multiple, mutually spaced, substantially parallel pinning stripes may be provided. Typically, such a chemical epitaxy template may comprise narrow pinning stripes spaced apart by neutral regions The patterned chemical epitaxy template may have the same periodicity (i.e. unit cell pitch) as the self-assembled lamellar block copolymer that it is intended to direct during self-assembly, or the periodic spacing between adjacent pinning sites will correspond to a plurality of unit cells, say 2 or 3 unit cells, for the self-assembled polymer. This allows for the effect known as density multiplication (sometimes also referred to as pitch multiplication).

An embodiment of the method may involve the self-assemblable block copolymer being adapted to form an ordered layer having first, discontinuous domains of the first block in a hexagonal or square array alternating with a second continuous domain of the second block therebetween. Suitably, only a single row of first, discontinuous domains of the first block may be arranged to lie over and along the slot.

In a further suitable arrangement, the block copolymer may be adapted to form an ordered layer which is a lamellar ordered layer, wherein the first domains are lamellae alternating with second domains which are also lamellae, the lamellae of the first and second domains oriented with their planar surfaces lying substantially normal to the substrate and substantially normal to the length of the trench.

A neutral orientation layer may be provided on the base of the trench overlying the portion of hard mask layer and the portion of the substrate in the trench. In a suitable arrangement, the neutral orientation layer may deposited onto the hard mask layer and the substrate prior to provision of the resist layer. The neutral orientation layer may be provided by a method described herein.

The slot may suitably have a width of about 30 nm or less.

The ordered layer of self-assembled block copolymer composition may be used as a further resist layer, for etching the row of mutually spaced lithography features along the slot on the substrate, by selective removal of the first domains followed by subsequent etching of the underlying substrate with the remaining second domains as an etch mask. The row of mutually spaced lithography features may used to provide contact electrodes for a NAND device.

For instance, the lithography features may be contact pads of a highly conductive material such as metal, deposited into holes formed using the elongate domains as removed resist features. In order to transfer a pattern from the ordered self-assembled polymer layer into the substrate, typically the first domains may be removed by so-called breakthrough etching to provide a pattern of the second domain on the surface of the substrate, in the slot, with the substrate laid bare, in the slot between the pattern features of the second domain.

Following the breakthrough etching, the pattern may be transferred by so-called transfer etching using an etchant which is resisted by the second domain and so forms one or more recesses in the substrate surface where the surface has been laid bare. The substrate surface may be covered by a dielectric layer, with one or more holes etched through the dielectric layer, to the underlying substrate. No such transfer etching will take place where the hard mask layer shields the substrate, and so the transfer etching will be restricted to take place within the slot. The holes may then be filled with metal to provide contact electrodes.

BRIEF DESCRIPTION OF THE DRAWINGS

Specific embodiments of the invention will be described with reference to the accompanying Figures, in which.

DETAILED DESCRIPTION

The described and illustrated embodiments are to be considered as illustrative and not restrictive in character, it being understood that only preferred embodiments have been shown and/or described and that all changes and modifications that come within the scope of the inventions as defined in the claims are desired to be protected.

Figure 1A:
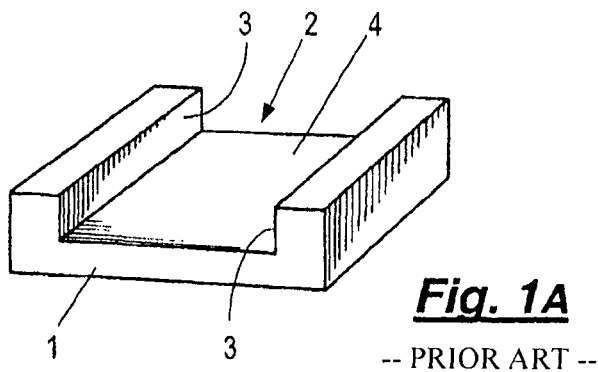
FIGS. 1A to 1C schematically depict prior art directed self-assembly of A-B block copolymers onto a substrate by graphoepitaxy and formation of relief patterns by selective etching of one domain.
Figure 1B:
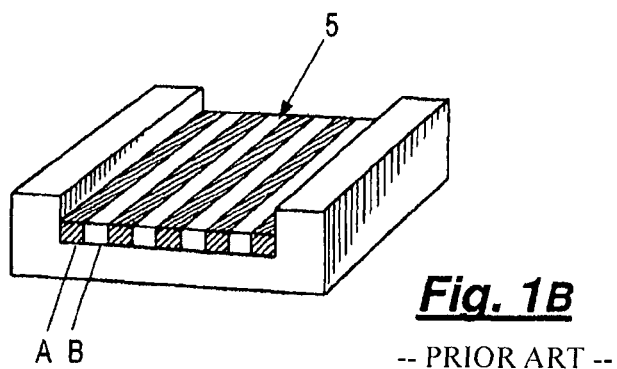
Figure 1C:
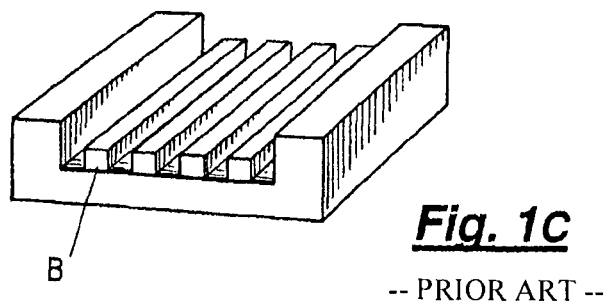

FIG. 1A shows a substrate 1 with a trench 2 formed therein bounded by side walls 3 and a bottom surface 4. In FIG. 1B, a self-assemblable A-B block copolymer with, e.g., hydrophilic A blocks and, e.g., hydrophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the a side wall 3, which is also, e.g., hydrophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
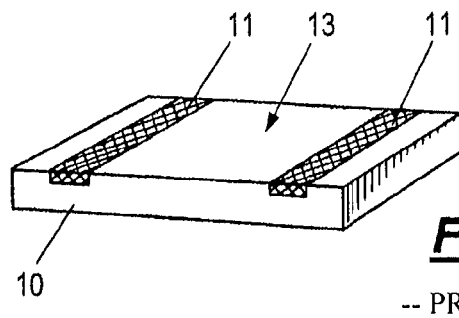
FIGS. 2A to 2C schematically depict prior art directed self-assembly of A-B block copolymers onto a substrate by chemical epitaxy and formation of relief patterns by selective etching of one domain.
Figure 2B:
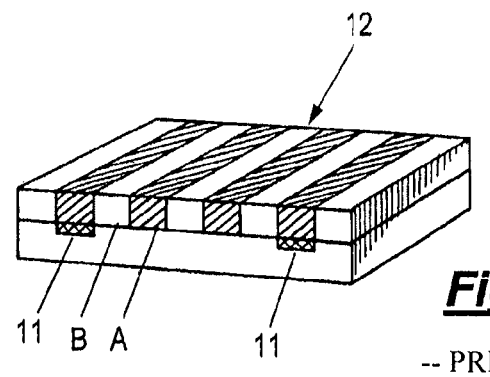
Figure 2C:
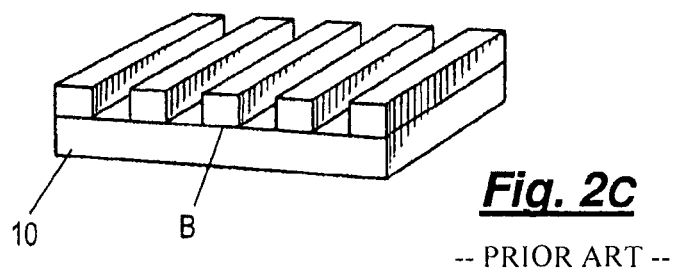

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with, e.g., hydrophilic A blocks and, e.g., hydrophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning or chemical epitaxy. The type A domains have nucleated atop the pinning or nucleation stripes 11, which are also, e.g., hydrophilic. In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

In the following examples, the di-block copolymer used as self-assemblable polymer in the composition is a poly(styrene-b-methylmethacrylate) block copolymer, denoted by the acronym PS/PMMA, arranged for self-assembly as explained herein. However, the method is also applicable to other self-assemblable block copolymers comprising different monomer types.

Figure 3A:
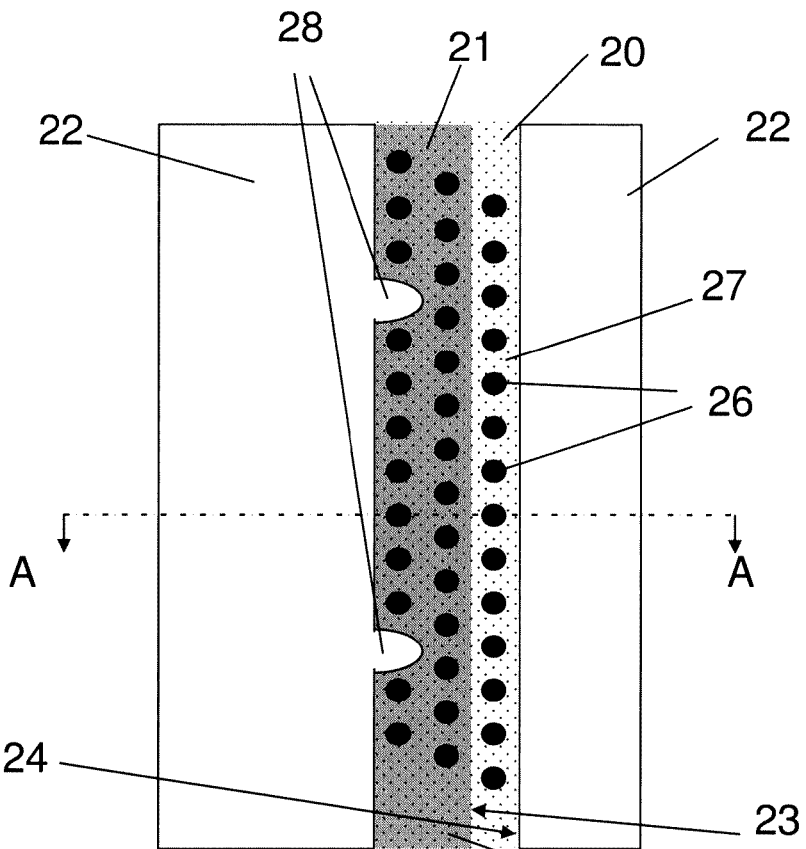
FIGS. 3A and 3B schematically depict plan and side cross-sectional views of a substrate undergoing a process according to an embodiment of the invention.
Figure 3B:
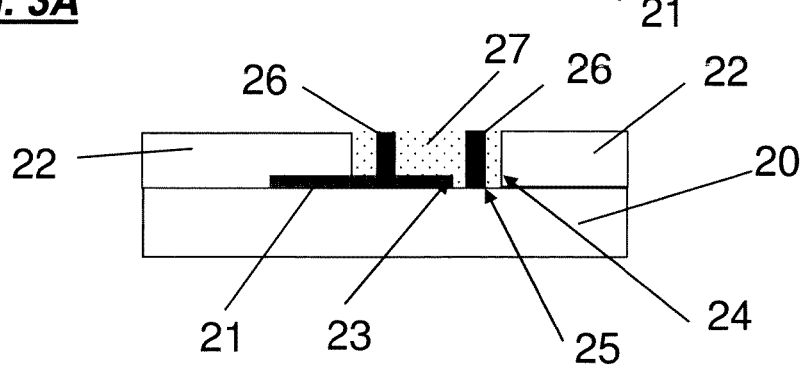

FIGS. 3A and 3B schematically depict plan and side cross-sectional views of a substrate undergoing a process according to an embodiment of the invention. FIG. 3B is a side cross-sectional view along the section A-A shown in FIG. 3A.

The Figures show the substrate 20 having a hard mask layer 21 deposited on its upper surface, with a layer of resist 22 provided over the surface of the substrate 20 and over a portion of the hard mask layer 21. A trench has been formed in the resist layer 22, the trench overlying a portion of the hard mask layer 21 and also overlying a portion of the bared substrate 20, the bared substrate 20 being present in a slot 25 located between an edge 23 of the hard mask layer 21 and a side-wall 24 of the resist layer 22 in the trench.

The Figures show the substrate 20 and overlying layers at a stage in the process where a self-assemblable block copolymer has been deposited in the trench and caused to self-assemble into an ordered layer constrained by the boundaries of the trench. For this embodiment, the self-assemblable block copolymer is adapted to self-assemble into an ordered pattern having hexagonal symmetry comprising cylindrical discontinuous first domains 26 mutually spaced within a hexagonal pattern having a second continuous domain 27 between the cylindrical discontinuous first domains 26. The spacing of the unit cells of the hexagonal ordered pattern is arranged relative to the width of the trench so that the self-assembly of the block copolymer may take place within the constraints of the trench to avoid undue stress in the resulting structure, which may otherwise potentially lead to defects in the ordered pattern. This is typically achieved by selecting the width of the trench to correspond to an integral number of unit cells of the hexagonal pattern, taking into account any intermediate zones adjacent to the side-walls where the blocks of the discontinuous domains may deposit as nucleation of the ordered pattern takes place. The appropriate trench width may be easily determined by a simple experimental method involving varying the trench width and monitoring the hexagonal pattern deposited, and its unit cell spacings by, for instance, scanning electron microscopy. In the embodiment shown, the side-walls of the trench have a high chemical affinity for the block of discontinuous domains, while the hard mask layer 21 and substrate 20 are neutral, having a similar chemical affinity for both the first and second blocks of the block copolymer. In a modification of this embodiment, the hard mask layer 21 and substrate 20 may have a neutral orientation layer deposited over their surfaces prior to the deposition of the resist layer 22 and formation of the trench.

In the embodiment shown, the trench has been provided with one or more graphoepitaxy features by the inclusion of one or more buttresses 28 on one of the side-walls of the trench, formed during the etching of the trench. The buttress 28 acts to replace one or more of the discontinuous domains of the ordered pattern as formed by the self-assemblable block copolymer, and hence direct the location of nucleation of the discontinuous domains 26 along the length of the trench.

The width of the slot 25 located between the edge 23 of the hard mask layer 21 and the side-wall 24 of resist layer 22 is arranged to be so that only one row of discontinuous domains 26 is formed over the slot 25. For instance, if the spacing between the centroids of the discontinuous domains is D, then the width of the slot may suitably be about $D/(3)^{1/2}$. The width of the slot 25 located between the edge 23 of the hard mask layer 21 and the side-wall 24 of resist layer 22 is suitably less than about 30 nm in width, such as about 20 nm in width.

The row of discontinuous domains 26 of the ordered block copolymer layer may subsequently be used as a resist for transfer etching of contact holes into the underlying substrate, along the defined slot 25, as already described hereinbefore.

Figure 4A:
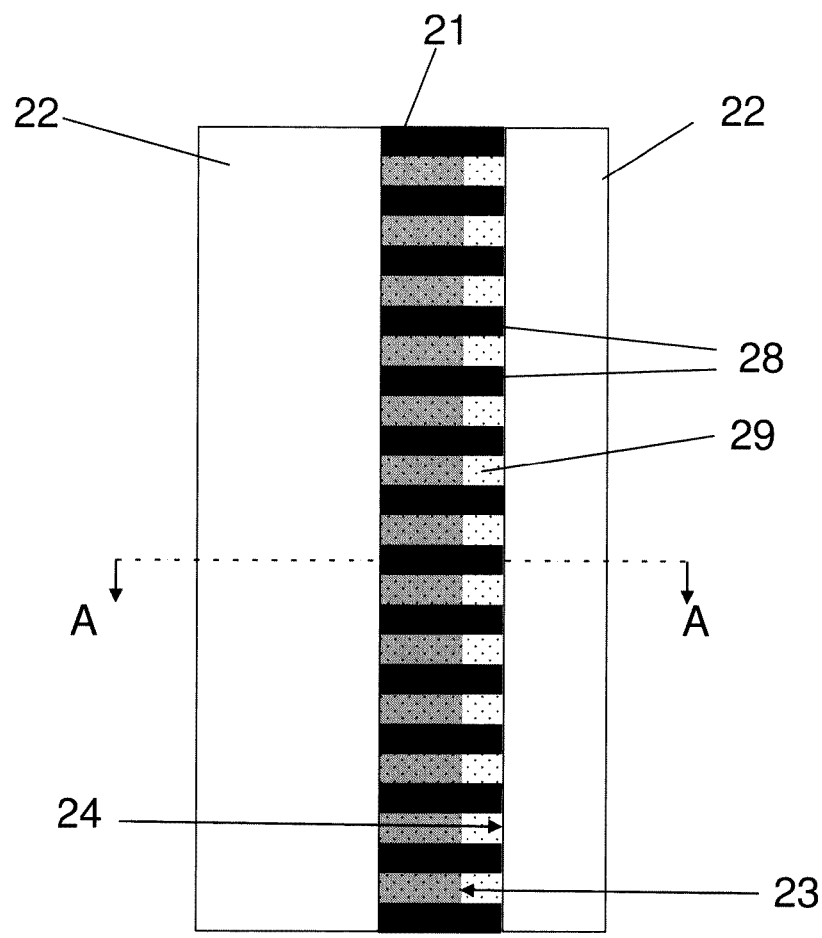
FIGS. 4A and 4B schematically depict plan and side cross-sectional views of a substrate undergoing a process according to an embodiment of the invention.
Figure 4B:
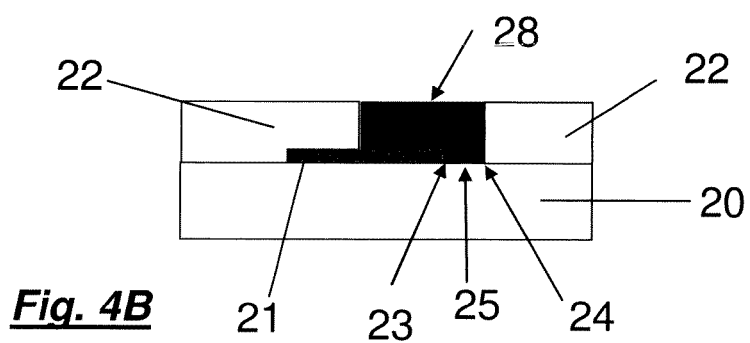

FIGS. 4A and 4B schematically depict plan and side cross-sectional views of a substrate undergoing a process according to an embodiment of the invention. FIG. 4B is a side cross-sectional view along the section A-A shown in FIG. 4A.

As with the embodiment of FIGS. 3A and 3B, the Figures show the substrate 20 having a hard mask layer 21 deposited on its upper surface, with a layer of resist 22 provided over the surface of the substrate 20 and of a portion of the hard mask layer 21. A trench has been formed in the resist layer 22, the trench overlying a portion of the hard mask layer 21 and also overlying a portion of the bared substrate 20, the bared substrate 20 being present in a slot 25 located between an edge 23 of the hard mask layer 21 and a side-wall 24 of the resist layer 22 in the trench.

The Figures show the substrate and overlying layers at a stage in the process where a self-assemblable block copolymer has been deposited in the trench and caused to self-assemble into an ordered layer constrained by the boundaries of the trench. For this embodiment, the self-assemblable block copolymer is adapted to self-assemble into an ordered pattern having a lamellar ordered layer wherein the first domains are lamellae 28 alternating with second domains 29 which are also lamellae, the lamellae 28, 29 of the first and second domains oriented with their planar surfaces lying substantially normal to the substrate and substantially normal to the length of the trench. In the embodiment shown, the side-walls of the trench have a neutral chemical affinity for the blocks of the first and second domains (i.e. a similar chemical affinity for both the first and second blocks of the block copolymer), while the hard mask layer 21 and substrate 20 are also both neutral, having a similar chemical affinity for both the first and second blocks of the block copolymer. In a modification of this embodiment, the hard mask layer 21 and substrate 20 may have a neutral orientation layer deposited over their surfaces prior to the deposition of the resist layer 22 and formation of the trench.

In a modification to the embodiment shown, the trench may be provided with one or more chemical epitaxy features by deposition of one or more pinning stripes prior to deposition of the resist layer and trench formation, on the substrate 20 (also optionally over the hard mask layer 21). The pinning stripe may be of a material having a higher chemical affinity for one of the domains (28 or 29) of the assembled lamellar block copolymer, than for the other domain. Hence, the bock copolymer self-assembly may be directed by the enthalpic driving force (minimization of total free energy) directing that domain of the block copolymer which has a high chemical affinity for the pinning stripe to be positioned over the pinning stripe as self-assembly proceeds. This provides the capability to align the positioning of the alternating lamellae along the slot length.

The width of the slot 25 located between the edge 23 of the hard mask layer 21 and the side-wall 24 of resist layer 22 is suitably less than about 30 nm in width, such as about 20 nm in width.

The row of alternating domains 28, 29 of the ordered block copolymer layer may subsequently be used as a resist for transfer etching of contact holes into the underlying substrate, as already described hereinbefore, for instance by removal of one of the domain types 28 leaving the other domain type 29 in place as a transfer etch mask for transfer of, for example, a row of contact holes, for contact electrode formation, into the substrate along the defined slot 25.

An embodiment of the invention allows for formation, onto a substrate, of one or more precisely located rows of mutually spaced lithography features, positioned side-by side along a substrate, using a self-assembled block copolymer to provide features which are hence closely spaced and small in size.

A particular technical benefit of the method is the ability to use a technique such as UV or DUV photolithography, having a resolution capability of say about 100 nm, to provide a slot over the substrate, the slot having a width considerably less than less than the resolution capability of the photolithography method. Typically, the alignment precision capabilities of a lithographic apparatus is about 1 to about 5 nm, much better than the resolution capabilities, and the method makes use of this by using the overlap between a broad trench formed by lithography and a hard mask edge formed by lithography to provide a slot of sub-resolution width. The slot may suitably have a width of about 30 nm or less and this means that it can be used to isolate a single row of self-assembled discontinuous domains from an ordered layer of self-assembled block copolymer aligned in the trench.

An embodiment of the present invention relates to a lithography method. The method may be used in a process for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of integrated circuits, bit-patterned media and/or discrete track media for magnetic storage devices (e.g. for hard drives). An embodiment of the invention is particularly useful for forming contact electrodes for a NAND device.

In particular, an embodiment of the invention is of use for high resolution lithography, where features patterned onto a substrate have a feature width or critical dimension of about 1 µm or less, typically about 100 nm or less or even about 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers which may be at, or form, the surface of the substrate, or may include one or more other layers such as those specifically mentioned above with reference to particular embodiments of the invention.

The invention claimed is:

1. A method of forming a row of mutually spaced lithography features on a substrate, the method comprising:
    forming a trench through a resist layer on the substrate, the resist layer overlying an edge of a hard mask layer on the substrate, by removal of a selected portion of the resist layer, aligned such that the trench has a length lying substantially parallel to the edge, the trench having opposed side-walls of resist and a base including the edge, a portion of the hard mask layer and a portion of the substrate, wherein the edge and a side-wall of the trench define a slot over the substrate, the slot having a width less than a width of the trench, providing a layer of self-assemble block copolymer, having first and second blocks, in the trench, causing the block copolymer to self-assemble to give an ordered layer in the trench, wherein the block copolymer is adapted to form the ordered layer comprising a row of first domains of the first block, self-assembled side-by-side in the slot, alternating with second domain of the second block, and using the ordered layer of block copolymer as a further resist layer for etching the row of mutually spaced lithography features along the slot on the substrate.

2. The method of claim 1, wherein the trench comprises an epitaxy feature configured to direct self-assembly of the block copolymer.

3. The method of claim 2, wherein the epitaxy feature comprises a recess and/or a buttress of a side-wall of the trench.

4. The method of claim 1, wherein the block copolymer is adapted to form an ordered layer having first, discontinuous domains of the first block in a hexagonal or square array alternating with a second continuous domain of the second block therebetween.

5. The method of claim 4, wherein only a single row of first, discontinuous domains of the first block is arranged to lie over and along the slot.

6. The method of claim 1, wherein the block copolymer is adapted to form an ordered layer which is a lamellar ordered layer wherein the first domains are lamellae alternating with second domains which are also lamellae, the lamellae of the first and second domains oriented with their planar surfaces lying substantially normal to the substrate and substantially normal to the length of the trench.

7. The method of claim 1, wherein a neutral orientation layer is provided on the base of the trench overlying the portion of hard mask layer and the portion of substrate in the trench.

8. The method of claim 7, wherein the neutral orientation layer is deposited onto the hard mask layer and substrate prior to provision of the resist layer.

9. The method of claim 1, wherein the slot has a width of about 30 nm or less.

10. The method of claim 1, wherein the ordered layer of block copolymer is used as a further resist layer for etching the row of mutually spaced lithography features along the slot on the substrate by selective removal of the first domains followed by subsequent etching of the underlying substrate with the remaining second domains as an etch mask.

11. The method of claim 1, wherein the row of mutually spaced lithography features is used to provide contact electrodes for a NAND device.

12. The method of claim 1, further comprising providing the hard mask layer on the substrate.

13. The method of claim 1, further comprising providing the resist layer on the substrate.

14. A method of forming a row of mutually spaced lithography features on a substrate, the method comprising:

providing a layer of self-assemblable block copolymer, having first and second blocks, in a trench, the trench being through a resist layer on the substrate, the resist layer overlying an edge of a hard mask layer on the substrate and the trench aligned such that the trench has a length lying substantially parallel to the edge, the trench having opposed side-walls of resist and a base including the edge, a portion of the hard mask layer and a portion of the substrate, wherein the edge and a side-wall of the trench define a slot over the substrate, the slot having a width less than a width of the trench, and causing the block copolymer to self-assemble to give an ordered layer in the trench, wherein the block copolymer is adapted to form the ordered layer comprising a row of first domains of the first block, self-assembled side-by-side in the slot, alternating with a second domain of the second block.

15. The method of claim 14, further comprising using the ordered layer of block copolymer as a further resist layer for etching the row of mutually spaced lithography features along the slot on the substrate.

16. The method of claim 14, wherein the trench comprises an epitaxy feature configured to direct self-assembly of the block copolymer.

17. The method of claim 16, wherein the epitaxy feature comprises a recess and/or a buttress of a side-wall of the trench.

18. The method of claim 14, wherein the block copolymer is adapted to form an ordered layer having first, discontinuous domains of the first block in a hexagonal or square array alternating with a second continuous domain of the second block therebetween.

19. The method of claim 14, wherein the block copolymer is adapted to form an ordered layer which is a lamellar ordered layer wherein the first domains are lamellae alternating with second domains which are also lamellae, the lamellae of the first and second domains oriented with their planar surfaces lying substantially normal to the substrate and substantially normal to the length of the trench.

20. The method of claim 14, wherein the row of mutually spaced lithography features is used to provide contact electrodes for a NAND device.

\* \* \* \* \*